Dec. 20, 1966 H. A. SMITH 3,293,572

ELECTRICALLY VARIABLE RESONANT CIRCUIT CONTROLLED BY THE FREQUENCY OF A SEPARATE PILOT INPUT SIGNAL

Filed June 26, 1964 4 Sheets-Sheet 1

INVENTOR:
HAROLD A. SMITH
BY
Frederick Breitenfeld
ATTORNEY

INVENTOR:
HAROLD A. SMITH
BY
Frederick Breitenfeld
ATTORNEY

INVENTOR:
HAROLD A. SMITH
BY Frederick Breitenfeld
ATTORNEY

INVENTOR:
HAROLD A. SMITH
BY
Frederick Breitenfeld
ATTORNEY

United States Patent Office 3,293,572
Patented Dec. 20, 1966

3,293,572

ELECTRICALLY VARIABLE RESONANT CIRCUIT CONTROLLED BY THE FREQUENCY OF A SEPARATE PILOT INPUT SIGNAL

Harold A. Smith, Plainfield, N.J., assignor to Devenco Incorporated, New York, N.Y., a corporation of New York Filed June 26, 1964, Ser. No. 378,376
6 Claims. (Cl. 333—17)

This invention relates to resonant circuits or filters, and more particularly to an arrangement for tuning such circuits.

A resonant circuit is a basic circuit of any radio receiver, and serves the function of frequency selection, i.e. it passes to the mixer or other stages of the receiver those signals having frequencies equal to or near the resonant frequency of the resonant circuit. All other signals are "filtered" out. The particular frequency or frequencies which a resonant circuit will pass depends upon the value of a reactance forming part of the circuit. Normally, this reactance value is variable, such as by turning the tuning dial of a standard radio, in order to permit the resonant circuit, at any one time, to pass only those signals which have a particular frequency.

Mechanical tuning of resonant circuits is very well known and may be accomplished by moving the plates of a variable capacitor closer together or further apart in order to vary the reactance of the capacitor. More recently, electrical tuning of resonant circuits has become known. This is accomplished by means of an electronic device, forming part of the resonant circuit, which offers a reactance comparable to that offered by a capacitor, the value of its reactance being dependent upon the value of an electrical signal, such as a voltage, applied to the device. Thus, by varying the voltage applied to the electronic capacitor, the resonant frequency of the resonant circuit is varied.

It is an object of the present invention to provide a tunable filter arrangement capable of tuning a resonant circuit or circuits to any chosen frequency extremely rapidly.

It is another object of the invention to provide such a filter arrangement which is highly reliable, long lived, and usable in a host of applications.

A feature of the tunable filter arrangement is that it can be quickly and accurately tuned from one frequency to another, and at the end of the tuning process the filter will remain indefinitely at its newly tuned frequency without further command. This ability to maintain a fixed tuned condition is obtained by generating an electrical signal by a process of addition of fixed voltage increments and employing this signal to control the reactance of the resonant circuit whereby the reactance achieves the value required to tune the resonant circuit to the desired frequency.

In one of its forms, the tunable filter arrangement of this invention includes an electrically variable resonant circuit and means for generating a tuning signal, which may be a variable voltage. The generated voltage is supplied to the resonant circuit for the purpose of tuning the latter. The voltage generating means, which may be referred to as a "staircase" generator, comprises a counter which in response to command signals varies the voltage by increasing, or, under certain circumstances decreasing, its magnitude in predetermined increments. Although specific reference is made to a staircase generator, it is to be understood that other types of digital-to-analog converters may be employed.

A pilot or reference signal having a frequency spectrum bearing a predetermined relationship to the frequency to which the resonant circuit is to be tuned is introduced into the resonant circuit. A comparator is provided to compare the pilot signal with the output signal of the resonant circuit and to generate a signal proportional to the relationship between them. This signal is applied to a programmer which responds by supplying the command signals employed to control the counters of the staircase generator. The voltage supplied to the resonant circuit by the staircase generator thus varies continuously until the comparator senses agreement between the pilot signal and the output signal of the resonant circuit, i.e. senses that the output signal of the resonant circuit has reached a frequency bearing the predetermined relationship to the frequency spectrum of the pilot signal. The comparator then commands the staircase generator to stop counting, i.e. stop varying its voltage output, whereupon the staircase generator locks in at the voltage corresponding to its count and thereafter continues to supply to the resonant circuit a constant voltage which maintains the resonant circuit tuned to the desired frequency.

A feature of the invention is the ability of the programmer to command the staircase generator to count both forward (i.e. to increase its output voltage) and reverse (i.e. to decrease its output voltage). When the input signal to the programmer is positive, it causes the staircase generator to count forward. However, when the output of the comparator is a small negative signal, indicating that the resonant circuit is tuned to a frequency just slightly above the desired frequency, the programmer causes the staircase generator to count reverse.

Another feature of the invention is the provision of a coarse error detector adapted to sense the output signal of the resonant circuit, and to control the speed of operation of the staircase generator counters. When there is little or no output signal from the resonant circuit, indicating that the resonant frequency of the circuit, at that moment, is very far from the pilot frequency, the coarse error detector causes the staircase counters to operate very rapidly in order to vary the voltage which changes the resonant frequency of the tuned circuit very rapidly. As soon as the output signal of the resonant circuit reaches a predetermined minimum strength, indicating that its resonant frequency is approaching the desired frequency, the coarse error detector causes the staircase counters to operate more slowly to minimize the possibility of the resonant frequency of the tuned circuit passing the pilot frequency without locking in.

Other objects and advantages of the invention will be apparent from the following description in which reference is made to the accompanying drawings.

Figure 1:
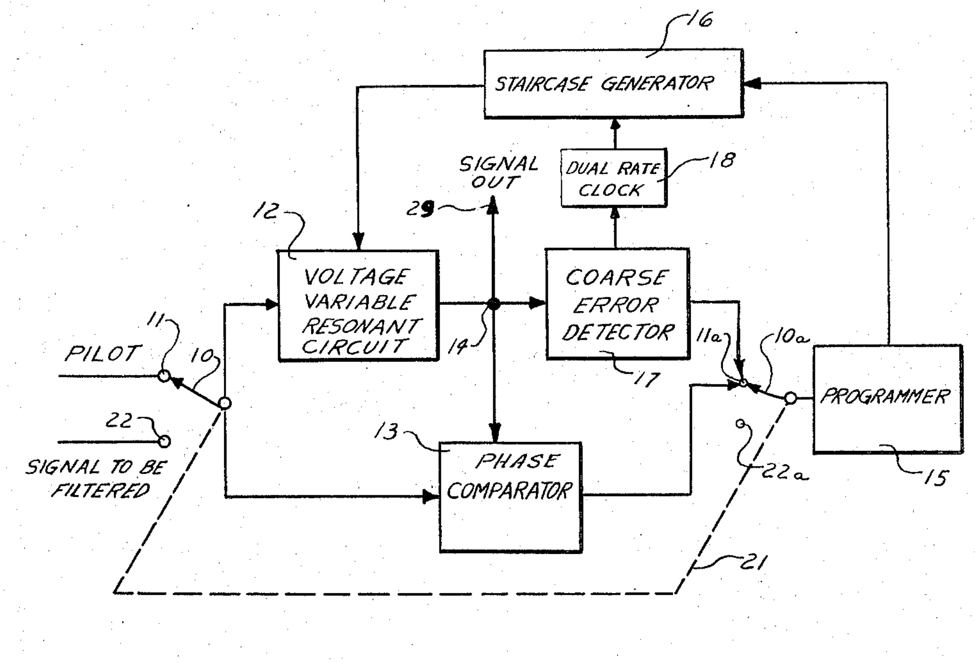
FIG. 1 is a simplified block diagram of an electronically tunable filter arrangement according to this invention.

The general mode of operation of an illustrative embodiment of the invention will be described with reference to FIGURE 1. A pilot signal present at terminal 11 and having a frequency spectrum bearing a predetermined relationship to the frequency to which the filter is to be tuned, is introduced, through mode switch 10, into a voltage variable resonant circuit 12. The pilot signal may be provided by any suitable means, not shown, such as a frequency generator. The pilot signal is referred to as having a frequency spectrum because it may have a single frequency or it may comprise a combination of several frequencies. The resonant circuit 12 may be of a well known type including an electrically variable reactance device such as a voltage variable capacitor, whose value changes with the variation in value of an electrical signal supplied to the device. As a result of the variation in value of the reactance device, the resonant frequency of the resonant circuit varies. For the sake of convenience, the resonant circuit will be referred to as "voltage variable," but it is understood that it need not be voltage which controls the resonant circuit.

The pilot signal present at terminal 11 is also introduced, through switch 10 into a comparator means 13. In addition, the output signal from the resonant circuit 12 flows through a junction 14 to the comparator means 13. The comparator means compares the output signal from the resonant circuit with the pilot signal, and produces a signal proportional to the relationship between them. The output signal from the comparator is transmitted, through a terminal 11*a* and another portion 10*a* of the mode switch, to a programmer 15. In response to the signal from the comparator, the programmer sends a command signal to a staircase generator 16 thereby conditioning the latter for operation. Upon receipt of the command signal, the staircase generator produces and supplies to the resonant circuit 12, or more correctly to the electrically variable reactance device forming part of it, a tuning signal, e.g. a voltage, which varies in discrete steps. It will be seen that a closed loop is thus completed, from the resonant circuit 12, through the comparator 13, programmer 15, staircase generator 16, and back to resonant circuit.

The variable reactor of the resonant circuit need not necessarily be an electrically variable device. The reactance may be mechanically variable, in which case the tuning signal generated by the staircase generator may be employed to tune the reactance device through a servo system or by a hydraulic system.

The output signal of the resnoant circuit, in addition to flowing to the comparator 13, also flows through the junction 14 to a coarse error detector 17. The operation of the coarse error detector is such that it responds to a small input signal by producing a large output signal, and responds to a larger input signal by producing substantially no output signal. The output signal of the coarse error detector operates a dual rate clock 18 which controls the speed with which the staircase generator counts. In addition the output signal of the coarse error detector is fed to the programmer 15, through terminal 11*a* and mode switch 10*a*.

Assume that the frequency spectrum of the pilot signal present at terminal 11 differs by a large amount from the resonant frequency of the circuit 12. As a result, there will be very little or no output from the resonant circuit. At this point, it might be expected that the comparator 13 would produce a large output signal, since there is a large difference between the pilot signal and the output signal of the circuit 12. However, in fact the output signal of the comparator 13 is of very low ampltiude because the total signal input into the comparator is small inasmuch as the resonant circuit is supplying practically no input to the comparator. On the other hand, since there is substantially no input signal to the coarse error detector 17 from the resonant circuit 12, the detector 17 produces a large positive D.C. output signal. The output signal of the coarse error detector is supplied to both the programmer 15 and the dual rate clock 18. The programmer responds to a positive signal input by conditioning the staircase generator to count forwardly, i.e. to increase its output voltage in discrete increments. Thus, the staircase generator begins counting toward its maximum output voltage and, unless it is stopped beforehand, when it reaches its maximum voltage, it instantaneously decreases to zero output voltage and begins counting forwardly again.

The dual rate clock 18, which may comprise a pair of multivibrators, one of which has a relatively high frequency output and the other a relatively low frequency output, also receives the output signal from the coarse error detector 17. Normally (when there is no output from the detector 17) the lower frequency multivibrator controls the speed of count of the generator 16. However, the signal from the coarse error detector turns off the slower multivibrator and makes the higher frequency multivibrator operative to control the counting speed of the generator 16.

The increasing voltage output from the generator 16 is supplied to the resonant circuit 12 and serves to vary the resonant frequency of the circuit. It will be appreciated that as long as the resonant frequency of the circuit 12 is relatively far from the frequency or frequencies of the pilot, the output signal from the coarse error detector causes the output voltage of the staircase generator 16 to increase extremely rapidly in stepwise fashion. As a result, the resonant circuit 12 is tuned toward the chosen frequency, i.e. the frequency having the predetermined relationship to the pilot, extremely rapidly. In fact, at this stage, the tuning rate is so rapid that if it were continued until the resonant frequency of the circuit 12 reached the selected frequency, the apparatus could not react fast enough at that instant to stop the staircase generator 16 from counting; and hence the circuit 12 would overshoot the selected frequency and proper tuning would be impossible.

As the resonant frequency of the circuit 12 draws closer to the desired frequency, the amplitude of the output signal from the circuit 12 begins to increase. When that output signal reaches a predetermined value, corresponding to a predetermined relationship between the frequency of the pilot and the resonant frequency of the circuit 12, it is sufficient to turn off the coarse error detector 17 so that the latter produces substantially no output. Consequently, the lower frequency multivibrator of the clock 18 takes over control of the staircase generator 16 and hence the output voltage of the generator is varied more slowly. Also, the coarse error detector no longer controls the programmer 15. Instead the programmer responds to the signal produced by the comparator 13 which is a D.C. signal proportional to the relationship between the pilot signal and output signal of the resonant circuit. If the output signal of the comparator is positive, the programmer will cause the staircase generator to continue to count forwardly. When the resonant frequency of the circuit 12 reaches the frequency having the predetermined relationship to the pilot frequency spectrum, or a frequency within a predetermined acceptable error therefrom, the comparator 13 senses agreement between the pilot and the output of the resonant circuit, and hence produces no or substantially no output signal. The programmer 15 responds to this circumstance by causing the staircase generator to discontinue counting. The generator, however, continues to produce an output voltage corresponding to the count at which it stopped. Thus, the resonant circuit 12 remains tuned to the selected frequency.

It sometimes happens that even at the relatively slow rate of change of the staircase generator output voltage, the changing resonant frequency of the circuit passes the selected frequency without halting the generator. When this happens, the output signal of the comparator becomes negative. As a consequence, the programmer commands the staircase generator to reverse direction and reduce its output voltage in stepwise fashion. The reverse count of the generator continues until a zero output of the comparator causes the programmer to command the staircase generator to stop counting, whereupon it locks in and maintains the resonant frequency of the circuit 12 at the chosen value.

The mode switch 10, 10*a*, the portions of which may be mechanically corrected to move together as indicated by the dotted line 21, may now be shifted from the terminals 11 and 11*a*, respectively, to the terminals 22 and 22*a*, respectively. The terminal 22 may be connected to an antenna, not shown, for picking up the signals to be filtered. A signal being transmitted at the frequency to which the resonant circuit has been tuned will be passed by the circuit 12 and may be extracted at the terminal 29. Since the switch 10*a* has moved to a position wherein it disconnects the programmer 15 from the comparator 13 and coarse error detector 17, variations in the signal being filtered will not affect the programmer and the staircase generator, and hence will not cause any change in the resonant frequency of the circuit 12. Although the mode switch 10, 10*a* is shown as a mechanical switch, it is obvious that its function may readily be performed by a suitable electronic switch.

It should be mentioned that more than one filter circuit, such as the circuit 12, may be coupled together by introducing the output of one filter into the next adjacent filter, and that each filter circuit can be tuned by means of its own comparator 13, programmer 15, staircase generator 16, coarse error detector 17, and clock 18. A separate pilot signal may be provided for each filter circuit, or the same pilot may be employed to tune all the filters. If the same pilot signal is used for all the filters, and if the filters are to be tuned to different frequencies, the separate phase shifters (to be mentioned below) associated with the filters will be arranged to shift the phase of the pilot signal by different amounts.

Figure 2:
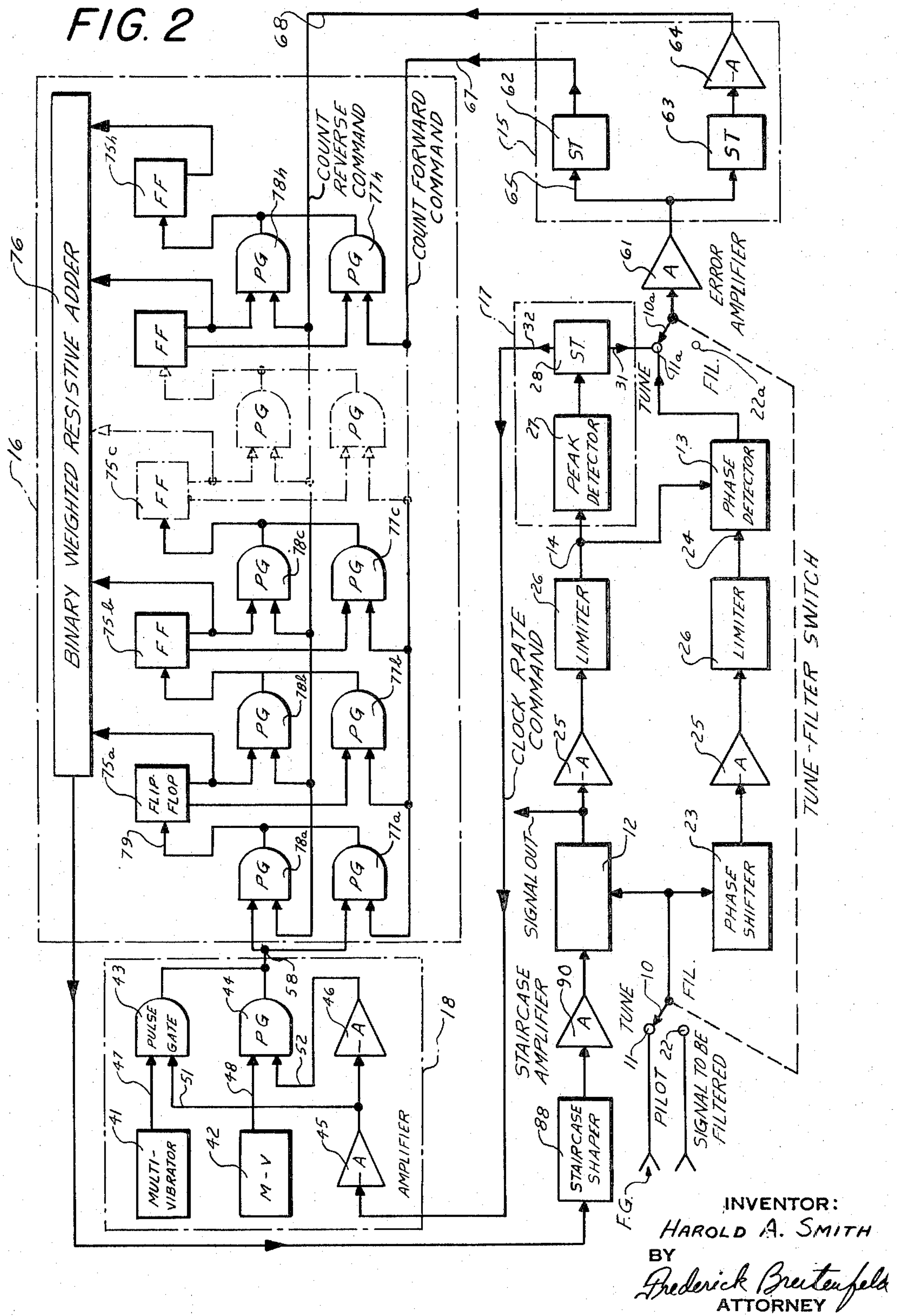
FIG. 2 is a more detailed block diagram of the filter arrangement.

Some of the components of the circuit of FIGURE 1 are shown in more detail in FIGURE 2, along with additional components of the arrangement. In one of its forms, the present invention employs as the comparator 13, a device capable of detecting the difference in phase between the pilot signal and the output signal of the resonant circuit 12, and producing an output signal proportional to this phase difference. Most phase detectors, including the one employed in the present example, operate best when the signals they are to compare are 90° out-of-phase under conditions of agreement, i.e., they sense agreement between the two signals when the two are 90° out-of-phase. For this reason, a phase shifter 23 of any well-known type is located in the reference circuit between the switch 10 and the terminal 24 through which the pilot signal is introduced into the phase detector 13. Thus, when the resonant frequency of the filter circuit 12 is brought to the frequency having the predetermined relationship to the pilot signal, so that the output signal of the filter circuit has a predetermined phase relationship to the pilot signal, the phase shifter introduces an appropriate shift into the pilot signal so that the two signals, when applied to the detector 13, are 90° out-of-phase whereby the detector senses agreement between the two signals. Where a signal filter circuit is being employed, the shifter 23 introduces a 90° shift into the pilot signal.

Located between the phase shifter 23 and phase detector or comparator 13 are one or more amplifier and limiter stages 25 and 26, one of each being shown in FIG. 2. Identical amplifier and limiter stages 25 and 26 are located between the resonant circuit 12 and the junction 14, which is directly connected to the phase detector. The function of these components is too well known to require extended discussion. However, it may be mentioned that the limiters 26 serve to limit the amplitude of the signals applied to the phase detector to some fixed value which the detector 13 can handle.

As described above, the output signal from the resonant circuit 12 flows from junction 14 to both the phase detector 13 and to the coarse error detector 17. In FIG. 2, the coarse error detector 17 is shown as including a peak detector 27 and a Schmitt Trigger 28. The detector 27 senses the peak voltage output of the resonant circuit 12 at every stage during the tuning of the resonant circuit, and produces a D.C. output signal equal to this peak voltage. The output signal is introduced into the Schmitt Trigger 28. The Schmitt Trigger 28 has two output terminals 31 and 32, the former being connected to the terminal 11*a* of the mode switch 10*a*, and the latter being connected to the amplifiers of the dual rate clock 18.

Figure 3:
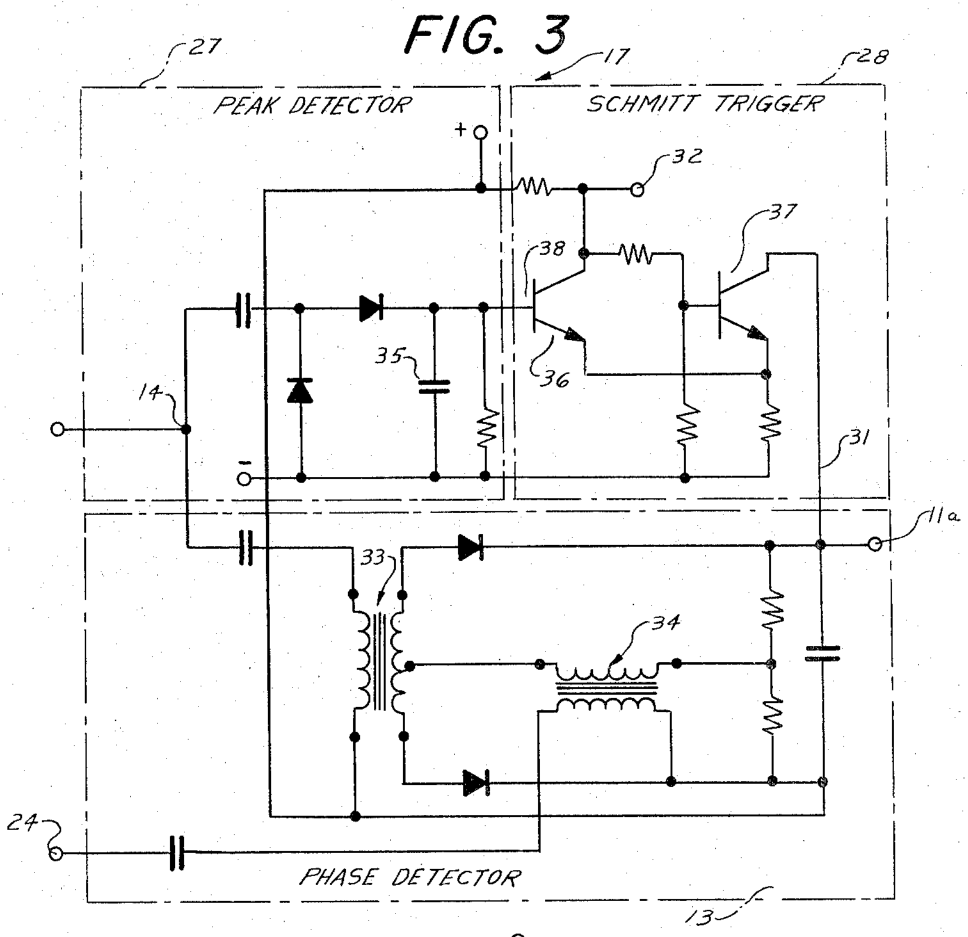
FIG. 3 is a schematic diagram of a phase detector and coarse error detector which may be employed in the present invention.

The phase detector 13, peak detector 27, and Schmitt Trigger 28 are shown in detail in FIG. 3. Individually, each of these components is well known, and hence their operation need not be described in detail. The phase detector, shown in the lower portion of FIG. 3 includes two transformers 33 and 34, the primary of transformer 33 being connected to the junction 14, whereby it receives the output signal of the resonant circuit 12, and the primary of transformer 34 being connected to the terminal 24 of the phase detector, whereby it receives the pilot signal from the phase shifter 23. The D.C. output of the phase detector is brought to the terminal 11*a*.

The peak detector 27, shown in the upper left-hand corner of FIGURE 3 includes a capacitor 34 which is charged by the signal appearing at junction 14. The charge on this capacitor obviously equals the peak voltage of the signal at any particular instant. The Schmitt Trigger 28, shown in the upper right-hand corner of FIG. 3, includes two transistors 36 and 37, the emitters of which are tied together to provide positive feedback. The output of the peak detector is a D.C. signal equal to the charge across the capacitor 35, and this output is applied to the base 38 of the transistor 36 of the Schmitt Trigger. The collector of transistor 36 is connected to the output terminal 32 of the Schmitt Trigger, and the collector of transistor 37 is connected by lead 31 to the terminal 11*a* of mode switch 10*a*. When the input signal to the Schmitt Trigger 28, via the base 38 of transistor 36, is low transistor 36 is in an "on" state wherein it conducts and transistor 37 is "off." The result is a relatively large negative output signal at lead 31 and a small positive output signal at terminal 32. When the input signal to the Schmitt Trigger rises above a predetermined threshhold value, transistor 36 turns off and transistor 37 turns on, with the result that a large negative output signal appears at terminal 32 and a small positive output signal appears at lead 31.

It is to be understood that the terms "large," "small," "negative," and "positive" as used herein are all relative terms. Thus, for example, an output signal of zero volts is both large and positive with respect to an output signal of minus six volts.

As mentioned above, the signal appearing at junction 14 (FIG. 2) is low when the resonant frequency of the filter circuit 12 differs to a large extent from the frequency of the pilot input. Under this condition, the input to the peak detector 27 and hence to the Schmitt Trigger 28 is low. Therefore, a small positive signal appears at terminal 32 of the Trigger 28 and is applied to the dual rate clock 18. As shown in FIG. 2, the clock includes two multivibrators 41 and 42, the multivibrator 41 sending out pulses at a relatively slow rate, say 10 kilocycles per second, and the multivibrator 42 sending out pulses at a relatively fast rate, say 100 kilocycles per second. The multivibrators 41 and 42 operate constantly, and feed pulses to pulse gates 43 and 44, respectively, via connections 47 and 48. These pulses are transmitted by the gates to the staircase generator 16 for the purpose of causing the counters of the generator to operate. The pulse gates 43 and 44 are caused to conduct alternatively by means of the inverting amplifiers 45 and 46, coupled to the pulse gates through connections 51 and 52, through which the signal from the terminal 32 of the Schmitt Trigger 28 is applied to the pulse gates. Thus, at any one time, either the pulse gate 43 conducts, whereby a relatively slow pulse rate is fed to the counters of the staircase generator 16, or the pulse gate 44 conducts, whereby a relatively fast pulse rate is fed to the counters.

Figure 6:
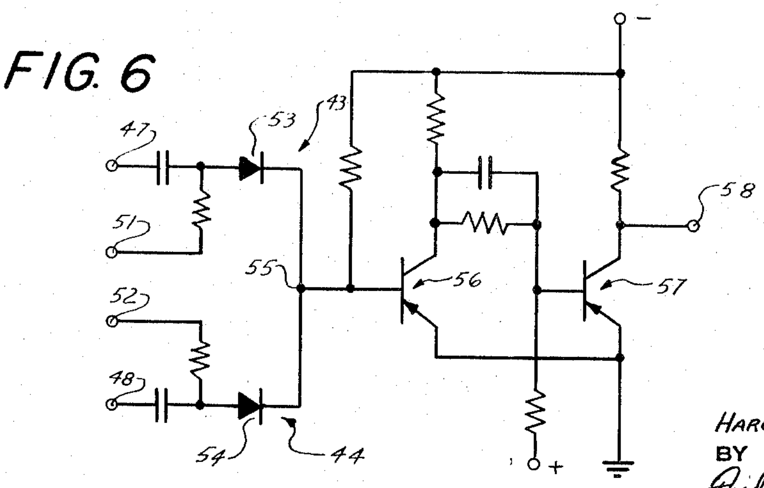
FIG. 6 is a schematic diagram of the gates employed to control the operation of the staircase counters.

The pulse gates 43 and 44, which are shown in more detail in FIG. 6, include diodes 53 and 54, respectively, the cathodes of which are tied together at junction 55. The circuits shown to the right of the junction 55 are common to both pulse gates and include transistors 56 and 57 which serve to amplify the pulses passed by either diode 53 or 54. The amplified pulses are delivered at terminal 58 (shown also in FIG. 2). The anode of diode 53 receives the output of amplifier 45 via the connection 51, and the anode of diode 54 receives the output of amplifier 46 via connection 52. In addition, the anodes of diodes 53 and 54 also receive the pulses from multivibrators 41 and 42 through connections 47 and 48 respectively.

When the small positive signal, mentioned above, flows to amplifier 45 from terminal 32 of the Schmitt Trigger 28, it is inverted whereby a negative signal is applied to the anode of diode 53 through connection 51. The diode is thereby reverse biased and does not conduct the pulses from the relatively slow multivibrator 41 to the junction 55. On the other hand, the negative output of amplifier 45 is inverted by amplifier 46, whereby a positive signal is applied to the anode of diode 54. This diode, therefore, conducts the pulses from the relatively fast multivibrator 42 to the junction 55. These pulses are amplified and delivered to the staircase generator and cause the counters to operate very rapidly. When a negative signal is present at terminal 32 of the Schmitt Trigger 28, a positive signal is applied to the anode of diode 53, by virtue of the inversion caused by amplifier 45, and a negative signal will emanate from amplifier 46, serving to reverse bias diode 54. Thus, the relatively slow clock pulses are delivered to the staircase generator causing its counters to operate more slowly. It will be seen, therefore, that when the resonant frequency of the filter circuit 12 is far from the frequency of the pilot, the staircase generator counters operate very rapidly, but when the resonant frequency approaches the pilot frequency, the operation of the counters is slowed.

The signal appearing at terminal 11*a*, which is the combined output signal of the phase detector 13 and signal present in the lead 31 of the Schmitt Trigger 28, is amplified at 61 (FIG. 2) and delivered to the programmer 15. The programmer comprises a count-forward circuit including a Schmitt Trigger 62, which receives the signal through terminal 65, and a count-reverse circuit including a Schmitt Trigger 63, which receives the signal through a terminal 66, and an inverting amplifier 64. The output signals from the count-forward and count-reverse circuits leave the programmer through connections 67 and 68, respectively, and are delivered to the staircase generator 16, in a manner to be described hereinafter, in order to cause the counters of the generator to either count in a direction to increase the output voltage of the generator (count forward) or to decrease it (count reverse).

When the signal entering the programmer 15 from the error amplifier 61 is relatively large, the Schmitt Trigger 62 is turned on and delivers a relatively large signal. At the same time, the Trigger 63 is turned off whereby it produces no or an insignificant output signal. Under these circumstances, the staircase generator is conditioned to count forward. On the other hand, when the input to the programmer is relatively small and negative, the Schmitt Trigger 62 is turned off, and the Trigger 63 is turned on. The output signal of the latter is inverted by the amplifier 64, and the generator 16 is conditioned to count in the reverse direction. The signal entering the programmer is relatively large when the resonant frequency of the filter circuit 12 is far from the chosen frequency and hence the output signal at connection 31 of the Schmitt Trigger 28 of the coarse error detector is large. The signal entering the programmer is also relatively large, i.e., large enough to turn on the Schmitt Trigger 62, when the phase detector 13 senses substantial disagreement between the pilot and filter output frequencies. However, when the resonant frequency of the filter circuit is a little higher than the pilot frequency, the phase detector produces a small negative signal which is sufficient to turn on the Schmitt Trigger 63, but insufficient to turn on the Trigger 62.

Figures 4, 5:
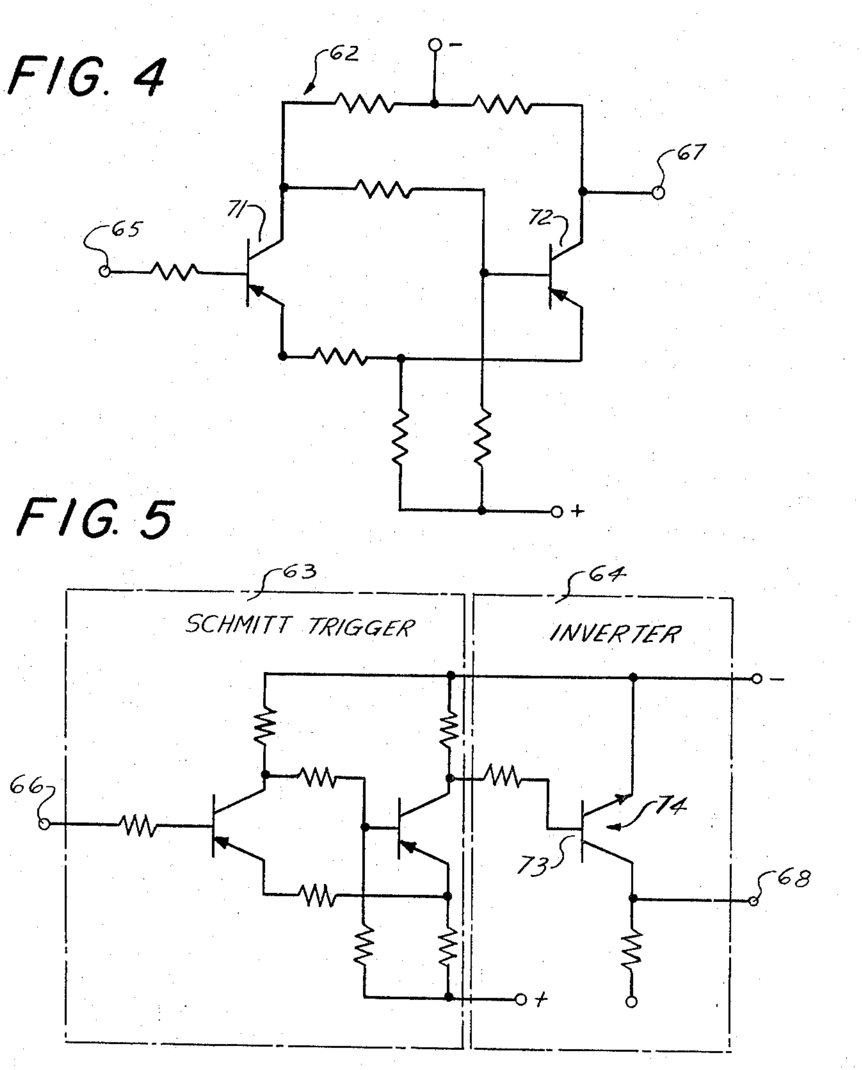
FIGS. 4 and 5 are schematic diagrams of components of the programmer.

The Schmitt Trigger 62, shown in more detail in FIG. 4, includes in well-known fashion, a pair of transistors 71 and 72, the emitters of which are coupled together to provide positive feedback. When a low input signal is applied at terminal 65, one transistor is turned on and the other off; when a high input signal is applied, the on and off conditions of the transistors are reversed. The Schmitt Trigger 63 and inverter amplifier 64 are shown in more detail in FIG. 5. The Trigger 63 is similar to the Trigger 62 of FIG. 4. The output signal of the Trigger 63 is applied to the base 73 of a transistor amplifier 74 which reverses the phase of the signal by 180°. The inverted signal appears at output terminal 68.

The staircase generator 16 comprises generally a series of counters 75*a*–75*h* coupled with a binary weighted resistive adder 76. Operation of the counters is controlled by two series of pulse gates, the count-forward pulse gates 77*a*–77*h*, and the count-reverse pulse gates 78*a*–78*h*. If Schmitt Trigger 62 is turned on, a count-forward command signal is sent through connection 67 to each of the count-forward pulse gates 77*a*–77*h* thereby conditioning each pulse gate to conduct. On the other hand, Trigger 63 is off, hence no signal is sent to the count-forward pulse gates 78*a*–78*h* and therefore these gates do not conduct. Pulses from one or the other multivibrator 41 or 42, as described above, appear at junction 58 and flow to pulse gates 77*a* and 78*a*. Only pulse gate 77*a* conducts, however, and the pulses are applied through it to the input terminal 81 of counter 75*a*. The counter 75*a* thereby performs a switching function, which by means of the adder 76 causes the output voltage of the staircase generator to increase by a predetermined increment. At the same time, pulses which appear at the output terminals 82 and 83 of the counter 75*a* are applied to the pulse gates 77*b* and 78*b*, respectively. These pulses are transmitted by the pulse gate 77*b* to the counter 75*b* which operates in a manner identical to the operation of the counter 75*a*. In this way, each of the remaining counters 75*c*–75*h* is operated in succession. As all the counters operate in unison, the output voltage of the generator 16 increases in predetermined increments. When the pulse gates 78*a*–78*h* are caused to conduct instead of the pulse gates 77*a*–77*h*, the counters operate to reduce the output voltage of the staircase generator in predetermined increments.

Figure 7:
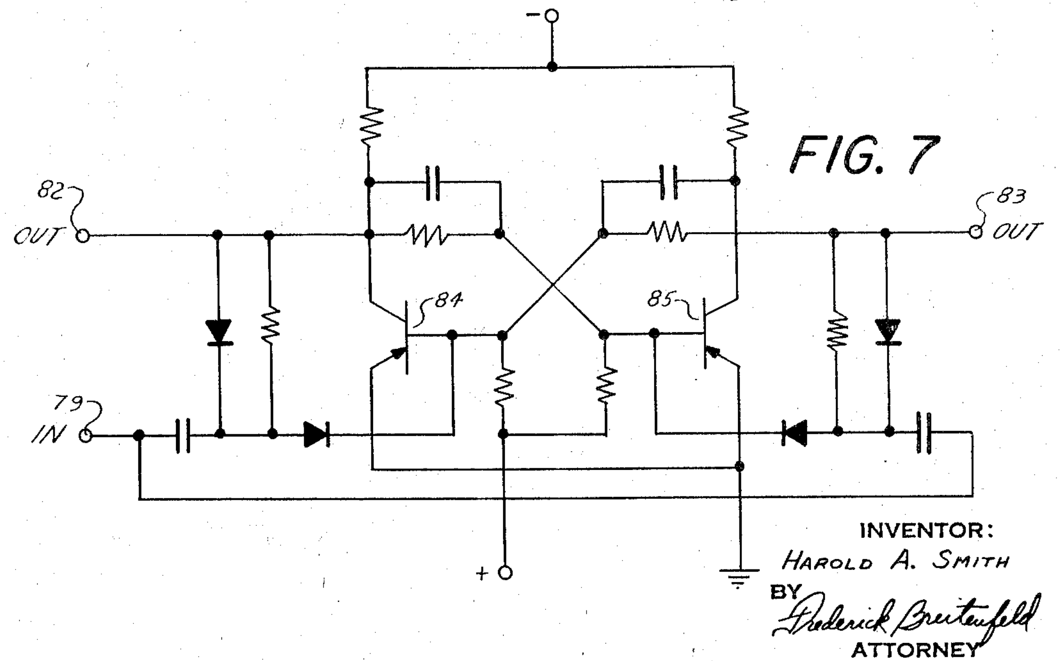
FIG. 7 is a schematic diagram of a staircase counter.

Each of the counters 75*a*–75*h* may be a flip-flop circuit such as that shown in FIG. 7 which is intended to represent the counter 75*a*. Flip-flop circuits as such are well known and include two transistors 84 and 85, only one of which conducts at any one time. Each time a pulse is applied to the input terminal 79 of the flip-flop circuit, the transistor which had been conducting ceases to conduct, and the transistor which had not been conducting begins to conduct. Consequently, each transistor may be employed as a switch which continuously closes and opens. As is known, the output frequency of a flip-flop circuit is one-half the input frequency. Thus, the switching operation of counter 75*a* is performed at twice the speed of the switching operation of counter 75*b*; counter 75*b* operates at twice the speed of counter 75*c*, and so forth. Further reference to the switching operation of the counters will be made hereinafter.

Each set of pulse gates 77*a*, and 78*a*, 77*b* and 78*b*, etc., is substantially identical to the pulse gates 43 and 44 shown in FIG. 6. However, instead of the diodes 53 and 54 being biased by means of amplifiers 45 and 46, they are biased by the count-forward and count-reverse command signals from the programmer 15. Also, instead of the diodes receiving pulses from the multivibrators 41 and 42, they receive pulses from the counters 75_a_, 75_b_, etc. preceding them. The only exceptions are the pulse gates 77_a_ and 78_a_ which receive pulses from the pulse gates 43 and 44.

Figure 8:
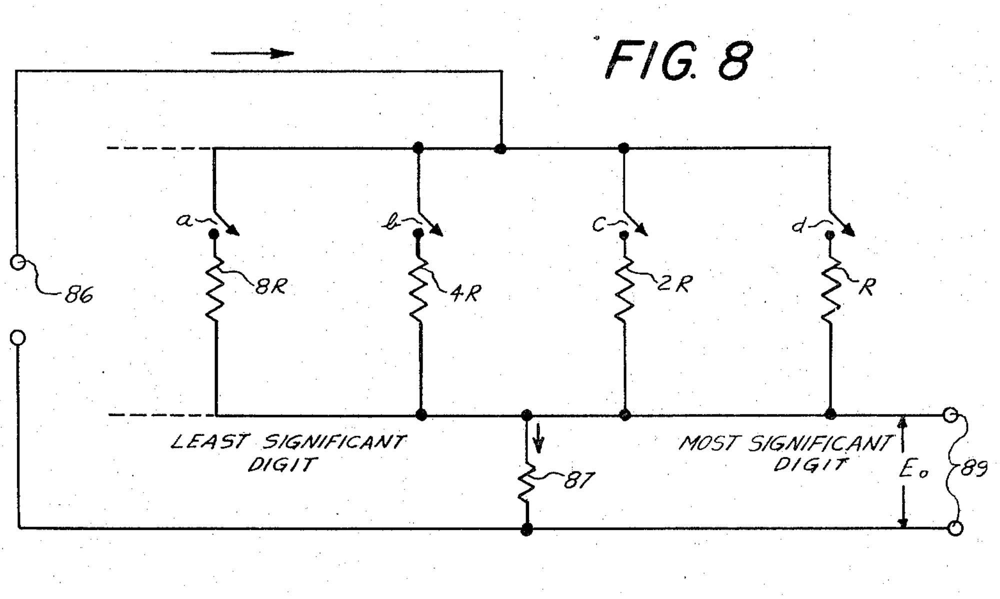
FIG. 8 is a schematic circuit employed to describe the operation of the staircase generator.

The use of a binary weighted resistive adder is well known in connection with producing a voltage output which varies in discrete steps. The manner in which this is done is indicated in FIG. 8. A series of resistors R, 2R, 4R, 8R, etc. is connected in parallel across a D.C. power source 86. Resistor 2R is twice the value of resistor R, resistor 4R is twice the value of resistor 2R, and so forth. Only four resistors are shown in FIG. 8, but obviously any number can be used. In series with each resistor is a switch; the switches bear reference letters "_a_" through "_d_" and correspond to the resistors 8R through R. The switches are intended to represent four of the flip-flop circuits 75_a_–75_h_. Therefore, switch "_a_" opens and closes at twice the rate of switch "_b_," and so forth. The output voltage of the arrangement appears across resistance 87, which may be a staircase shaper 88 shown in FIG. 2, and is extracted at terminals 89. The arrows indicate the flow of current through the arrangement.

The value of the current, I, at any moment, is determined by the following relationship, assuming resistance 87 is small compared to the values of the resistors R–8R:

$$I=V/R_t$$

where V is the value of the D.C. voltage source 86, $R_t$ is the total resistance of resistors R–8R which are in the circuit at the moment. The value of the output voltage $E_0$ at terminals 89 is as follows:

$$E_0=rI$$

where $r$ is the value of resistance 87. Thus, $E_0=rV/Rt$. $Rt$ is equal to NR, where N is a number dependent upon which of the switches "_a_"–"_d_" are closed at any particular time. Therefore, $E_0=rV/NR$, and since $r$, V, and R are constants, $E_0=A/N$, and $E_0/A=1/N$.

When the arrangement of FIG. 8 begins operation, switch "_a_" closes but the other switches remain open. Consequently, $N=8$, and $E_0/A=.125$. Switch "_a_" then opens and switch "_b_" closes, the other switches remaining open. N now equals 4, and $E_0/A=.25$. In response to the next pulse, switch "_a_" closes, but switch "_b_" remains closed and the other switches remain open. N therefore equals 8/3, and $E_0/A=.375$. The following pulse causes switches "_a_" and "_b_" to open and switch "_c_" to close. Hence, N equals 2, and $E_0/A=.5$. This operation continues, with each switch "_a_"–"_d_" operating at half the rate of the preceding switch. It will be seen, therefore, that the output voltage of the staircase generator changes in discrete steps. The output voltage continues to vary until neither the Schmitt Trigger 62 nor 63 produces an output signal sufficient to forward bias the pulse gates 77_a_–77_h_ or 78_a_–78_h_. This occurs when the phase detector 13 senses agreement between the output signal of the filter circuit 12 and the pilot signal. Consequently, the pulses from the multivibrators do not get past the pulse gate 77_a_ or 78_a_, and the counters 75_a_–75_h_ therefore stop counting. The output voltage of the staircase generator remains at the value achieved at the last count.

The output voltage of the staircase generator appears across the staircase shaper 88 (FIG. 2), is amplified at 90, and applied to the voltage-variable element of the resonant circuit 12. The staircase shaper is employed because the impedance value of the voltage variable element of the circuit 12 does not vary linearly with the voltage applied to it. The shaper 88 serves to vary the gain of the staircase amplifier 90 in inverse proportion to the variation of impedance value of the voltage variable element with change in voltage, and thereby causes the resonant frequency of the filter circuit 12 to vary linearly with the variation in voltage supplied by the staircase amplifier.

It will be readily be seen that the present invention provides a means for very rapidly tuning an electrically tunable filter circuit. Thus, in several thousandths of a second the filter can be tuned from one frequency to another. With the present invention, the filter can be caused to scan over a band of frequencies and, at the rate of a thousand a second or more, monitor the frequencies. In such a case, a sweeping oscillator, or a frequency generator controlled by a punched tape could be used to provide the series of pilot signals having the frequencies to which the filter is to be timed.

The invention has been shown and described in preferred form only and by way of example, and many variations may be made which will still be comprised within the spirit of the invention. It is understood, therefore, that the invention is not limited to any specific form or embodiment except insofar as such limitations appear in the appended claims.

What is claimed is:

1. An electrically tunable filter arrangement comprising:
(a) An electrically variable resonant circuit;
(b) Means for producing and supplying to said resonant circuit a tuning signal which varies in discrete steps for the purpose of tuning said resonant circuit;
(c) Means for applying a pilot signal to said resonant circuit, the frequency spectrum of said pilot signal bearing a predetermined relationship to the frequency to which the resonant circuit is to be tuned;
(d) Means for comparing the output of said resonant circuit with said pilot signal and generating a signal proportional to the relationship between them; and
(e) Means responsive to the signal generated by said comparing means for conditioning said tuning signal producing means for stepwise variation when the resonant frequency of resonant circuit is outside a predetermined value from the desired frequency, and for maintaining said tuning signal at one of the discrete output values of said tuning signal producing means when the resonant frequency of said resonant circuit is within said predetermined value from the desired frequency.

2. An electrically tunable filter arrangement as defined in claim 1 wherein said tuning signal supply means includes a counter, generating tuning signals corresponding to its count.

3. An eletrically tunable filter arrangements as defined in claim 2 wherein said responsive means includes programming means operatively connected between said comparing means and said counter for conditioning said counter to count forward or to count reverse depending upon the sign of the signal generated by said comparing means.

4. An electrically tunable filter arrangement as defined in claim 2 including a relatively high frequency multivibrator and a relatively low frequency multivibrator alternatively connectable to said counter in order to cause said counter to count at a relatively fast rate or a relatively slow rate, said low frequency multivibrator normally being connected to said counter, and a coarse error detector responsive to an output signal from said resonant circuit when said resonant circuit is tuned far from the desired frequency for causing said high frequency multivibrator to be connected to said counter and said low frequency multivibrator to be disconnected.

5. An electrically tunable filter arrangement as defined in claim 4 wherein said responsive means includes programming means operatively connected between said coarse error detector and said counter for conditioning said counter to count forward or to count reverse, said coarse error detector causing said programming means to condition said counter to count forward when said resonant circuit is tuned far from the desired frequency.

6. An electrically tunable filter arrangement as defined in claim 5 wherein said programmer is also operatively connected between said comparing means and in said counter, said coarse error detector being ineffective to control said programmer when the resonant frequency of said resonant circuit is within a predetermined value from the desired frequency, and said comparing means being effective to control said programmer when the resonant frequency of said resonant circuit is within said predetermined value from the desired frequency, said programmer conditioning said counter to count forward or to count reverse depending upon the sign of the signal generated by said comparing means.

References Cited by the Examiner

UNITED STATES PATENTS

| | | | |
|---|---|---|---|
| 2,304,377 | 12/1942 | Van B. Roberts | 334—26 |
| 2,524,281 | 10/1950 | Winfield | 334—26 X |
| 2,584,004 | 1/1952 | Enslein | 334—27 |
| 2,775,700 | 12/1956 | Ring | 324—82 X |

HERMAN KARL SAALBACH, *Primary Examiner.*

P. L. GENSLER, *Assistant Examiner.*